(12) United States Patent
Tigwell et al.

(10) Patent No.: US 7,518,369 B2
(45) Date of Patent: Apr. 14, 2009

(54) HIGH-MAGNETIC FIELD MRI SYSTEM WITHIN A HOUSING AND A METHOD OF OPERATING AN MRI SYSTEM WITHIN A HOUSING

(75) Inventors: Neil Charles Tigwell, Oxon (GB); Stephen Paul Trowell, Oxon (GB)

(73) Assignee: Siemens Magnet Technology Ltd. (GB)

( * ) Notice: Subject to any disclaimer, the term of this patent is extended or adjusted under 35 U.S.C. 154(b) by 0 days.

(21) Appl. No.: 12/166,903

(22) Filed: Jul. 2, 2008

(65) Prior Publication Data
US 2009/0009170 A1 Jan. 8, 2009

(30) Foreign Application Priority Data
Jul. 4, 2007 (GB) .................................. 0712920.8

(51) Int. Cl.
*G01V 3/00* (2006.01)

(52) U.S. Cl. ...................................... 324/318; 324/307

(58) Field of Classification Search .................. 324/318
See application file for complete search history.

(56) References Cited

U.S. PATENT DOCUMENTS

| 5,488,339 A | * | 1/1996 | Havens et al. ................ 335/216 |
| 5,994,903 A | * | 11/1999 | Ladebeck .................... 324/319 |
| 2006/0186884 A1 | | 8/2006 | Mallett et al. |

* cited by examiner

*Primary Examiner*—Brij B Shrivastav
*Assistant Examiner*—Megann E Vaughn
(74) *Attorney, Agent, or Firm*—Schiff Hardin LLP

(57) ABSTRACT

An MRI system is housed within a housing that is provided with a set of deployable barriers that are attachable to the housing. The magnet in the MRI system may be operated at a first magnetic field intensity, such that the magnetic field outside of the housing remains below a safety limit when the barriers are not deployed. The magnet in the MRI system may be operated at a second magnetic field intensity, higher than the first, when the barriers are deployed, such that the magnetic field outside of the barriers remains below the safety limit.

23 Claims, 3 Drawing Sheets

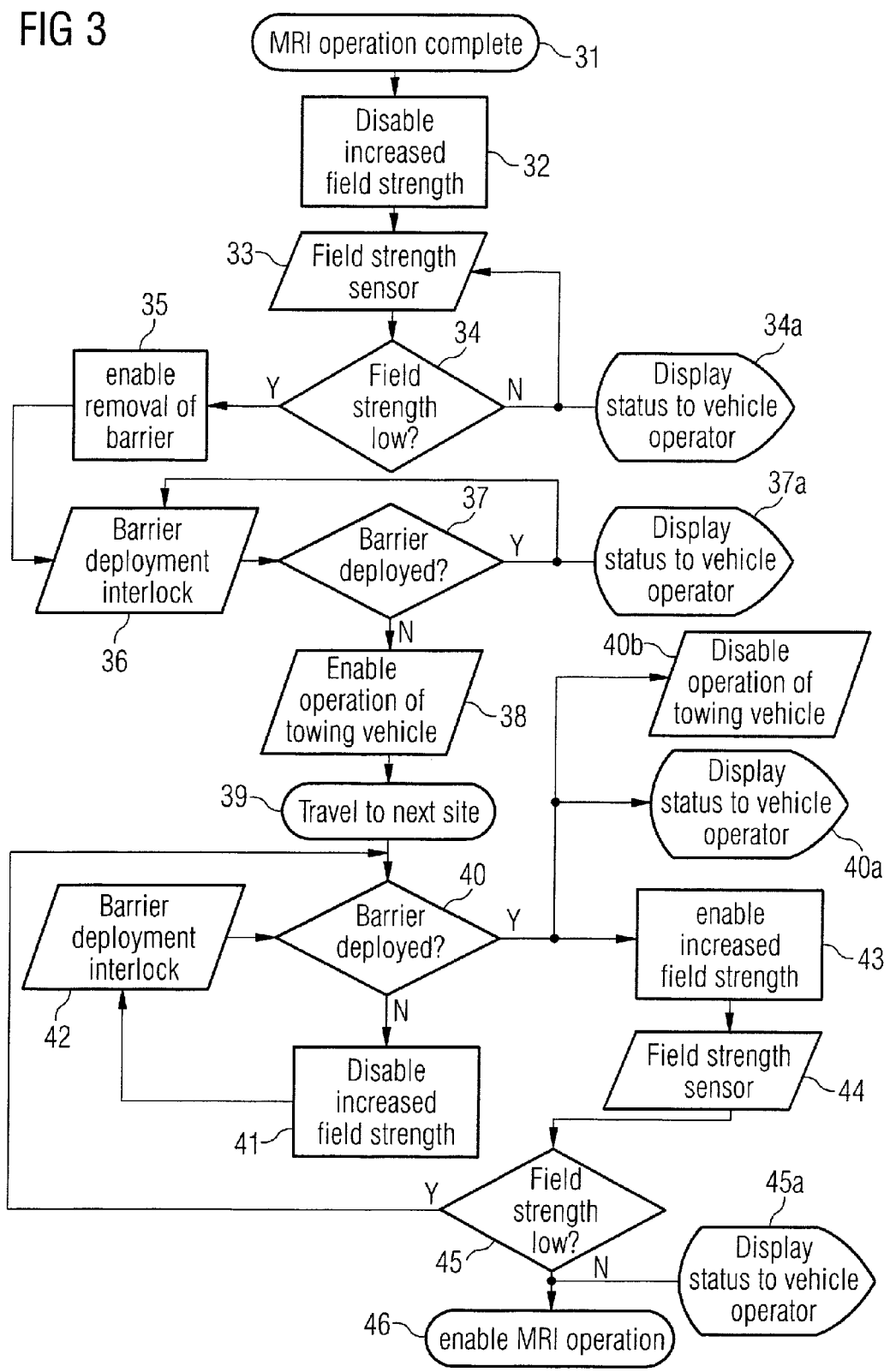

HIGH-MAGNETIC FIELD MRI SYSTEM WITHIN A HOUSING AND A METHOD OF OPERATING AN MRI SYSTEM WITHIN A HOUSING

BACKGROUND OF THE INVENTION

1. Field of the Invention

The present invention concerns a magnetic resonance imaging (MRI) system having a housing that allows the system to be used in environments that must not be exposed to the high magnetic field of the system.

2. Description of the Prior Art

Mobile magnetic resonance imaging systems have been known for some time. An MRI system represents a substantial financial investment, which may be beyond the means of many communities and local health authorities. In order to provide MRI services to such communities, some businesses provide mobile MRI systems which can be made available in a certain locality for a certain time before moving on to a next locality. Each community or local health authority will only pay for the time that the mobile MRI system is at their disposal. A mobile MRI system typically occupies the trailer of an articulated HGV, and travels on the public highways. By careful planning and scheduling of imaging procedures, MRI imaging is made available to communities and local health authorities which would otherwise be denied such facilities, or would have to arrange for patients to travel, sometimes significant distances, to attend a fixed MRI centre.

Legislation, for example in the United States and the European Union, places restrictions on the intensity of magnetic field which may be emitted into the surrounding environment by installations such as mobile MRI trailers (known as the stray magnetic field). Presently, the maximum allowed stray magnetic field intensity is 5 gauss. In the context of trailer-mounted mobile MRI systems, regulations require the 5 gauss magnetic field intensity contour to be within the external surfaces of the trailer up to a height of 8 feet (2.5 m) from the ground on which the trailer is sitting.

Present mobile MRI systems typically employ superconducting magnets having a magnetic field strength of 1.5 T or less. The magnetic fields of such magnets can be constrained within the body of the trailer of an HGV, by such expedients as active shield coils within the magnet, and ferromagnetic shielding of the trailer walls, as discussed for example in United States Patent Application Publication No. 2006/0186884 A1.

It is generally accepted that improved quality images can be achieved in MRI if a magnet of increased magnetic field strength is used. Current fixed MRI systems routinely employ magnets having a magnetic field strength of 3 T. It is desired to use such magnets in mobile MRI facilities. However, it has been found difficult to constrain the stray magnetic field of magnets having a magnetic field strength much in excess of 1.5 T to within the dimensions of an HGV trailer. For example, FIG. 1 illustrates a model of stray magnetic field emitted by a current 3 T magnet placed within a mobile MRI system trailer designed to accommodate a 1.5 T magnet. The trailer in question is a Medical Coaches "AVANTO" United States-specification trailer. The outermost magnetic field contour line shown in FIG. 1 represents the 5 gauss magnetic field strength contour. As can be seen, the 5 gauss contour extends significantly beyond the walls of the trailer, despite the trailer being sufficient to constrain the magnetic field of a 1.5 T magnet such that its 5 gauss contour falls within the walls of the trailer. In the example shown in FIG. 1, the trailer walls are unable to constrain even the 50 gauss contour.

One solution may be to add further passive shielding to the trailer, in the form of iron plates on the walls of the trailer. However, it has been found that the additional mass provided by the necessary quantity of iron shielding would make the resultant trailer impractically heavy for road transport. Furthermore, it is known that even small displacements of shielding material, due to thermal expansion or the effect of wind for example, will interfere with the stability of the magnetic field. This is already an issue for screened trailers for 1.5 T magnets, and would become a more serious issue if further screening were introduced.

Another alternative would be to increase the dimensions of the trailer such that the 5 gauss contour remains within the walls of the trailer. This solution has also been found impractical, as the resultant size of trailer required to transport a 3 T magnet would be too large for normal road transport.

Further conceivable alternatives include providing additional shield coils within the magnet to reduce the stray magnetic field at source. These shield coils could be superconducting coils in the cryostat or resistive coils mounted externally to the cryostat. Both options are expensive, add weight, and in the latter case would require significant power and cooling to operate.

SUMMARY OF THE INVENTION

An object of the present invention is to provide a practical trailer for transporting a mobile MRI system, and a practical method of operating a mobile MRI system, at an acceptable cost and without unduly complicating construction of the MRI system itself. Such method and trailer enable a high magnetic field magnet, such as one providing a magnetic field of 3 T or more, to be used in a mobile MRI system while conforming to existing regulations of stray magnetic field emissions. It is also envisaged that the trailer and method of the present invention may be easily adapted to cope with magnets of yet higher magnetic field strength, and more stringent regulations on stray magnetic field emissions.

The above object is achieved in accordance with the present invention by a high-magnetic field MRI system, and a method for operation thereof, wherein the MRI system has a housing provided with a set of deployable barriers that are attached to the housing so that the magnet of the MRI system can be operated to generate a magnetic field of a first field intensity with the magnetic field outside of the housing remaining below a safety limit when the barriers are not deployed, and wherein the magnet in the MRI system can be operated to produce a magnetic field at a second magnetic field intensity, higher than the first intensity, when the barriers are deployed, with the magnetic field outside of the barriers still remaining below the safety limit, and wherein the system is provided with an interlocked arrangement so that the magnet cannot be operated to produce a magnetic field having a field intensity higher than the first magnetic field intensity unless the barriers are detected as being deployed.

BRIEF DESCRIPTION OF THE DRAWINGS

FIG. 3 shows a flow diagram of operations required to install and employ a mobile MRI system according to the present invention.

DESCRIPTION OF THE PREFERRED EMBODIMENTS

According to the present invention, a high magnetic field magnet is made available for use in a mobile MRI system by a operating the magnet at a first magnetic field intensity, lower than its intended operational intensity, for transport. In such state, the magnetic field outside of the trailer is restricted to remain below a safety limit (e.g. 5 gauss). A 5 gauss line will be referred to in the present description, as an example of a maximum allowed external magnetic field. Of course, the present invention may be applied to the confinement of magnetic fields of other strengths, as required. The MRI system may accordingly be transported between operational sites using magnetic screening on a trailer, and conventionally sized trailers. In a particular example, a magnet capable of producing a 3 T magnetic field is energized only to produce a 1.5 T magnetic field, and then transported in a conventional trailer known for use with 1.5 T magnets.

Figure 1:
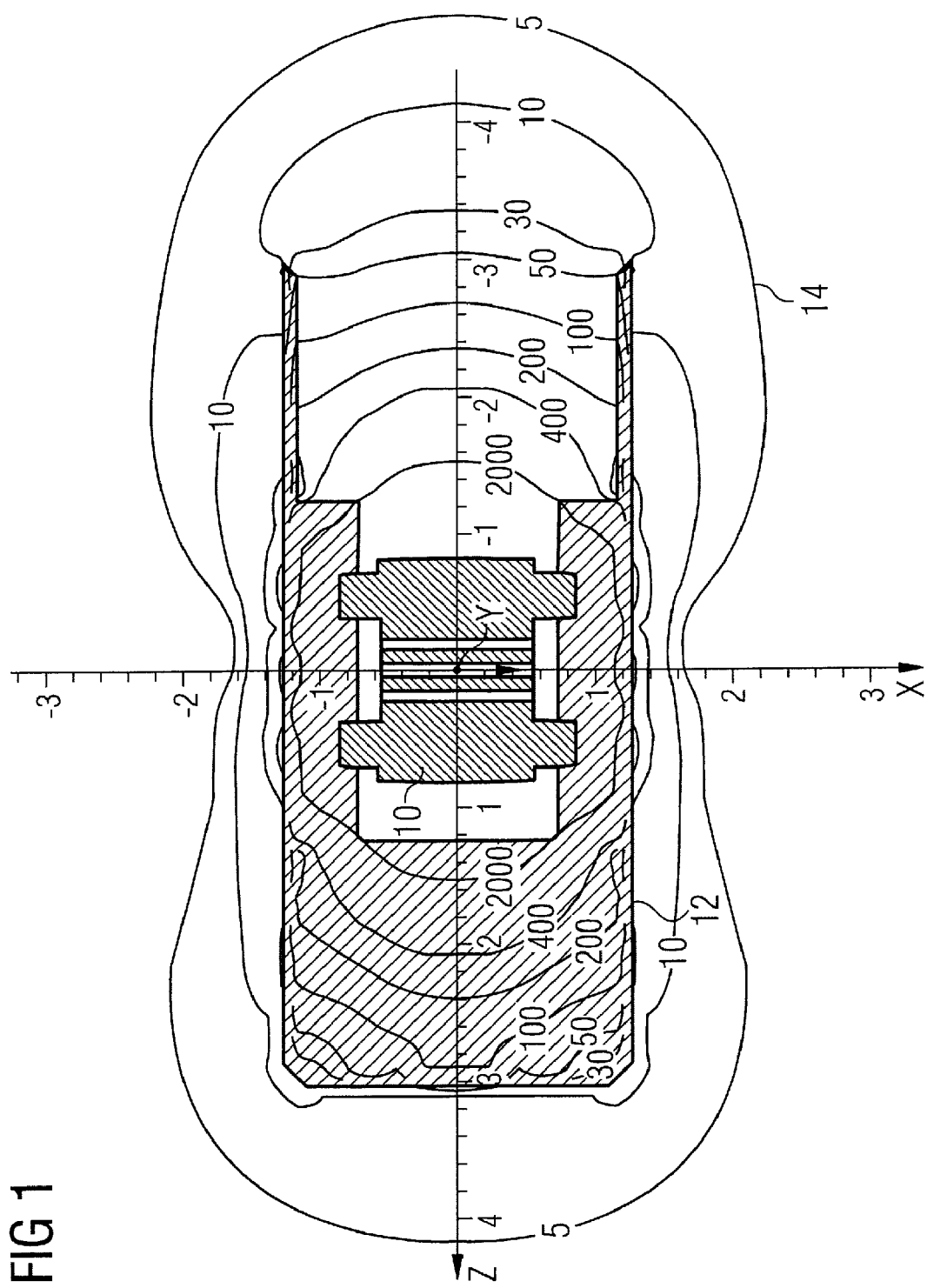
FIG. 1 shows a plan view of a conventional trailer for mobile MRI system, fitted with a 3 T magnet, and contours of the resulting stray magnetic field.

When the mobile MRI system arrives at its operational site, the magnet may be further energized to produce its full magnetic field, for example 3 T. Such intensity of magnetic field will not be sufficiently constrained by the conventional MRI trailer. FIG. 1 shows a simulation of a 3 T magnet 10 placed within a conventional trailer 12 suitable for transporting 1.5 T magnets at field. As can be clearly seen, the 5 gauss contour 14, representing the maximum permissible stray magnetic field, extends significantly beyond the walls of the trailer. In simulations, a 3 T magnet operating as illustrated has a 5 gauss magnetic field contour line extending approximately 1 m beyond the side and rear walls of the trailer, and further from the open, access, end of the trailer. Operation in such condition is not permitted by regulations.

According to a second aspect of the present invention, deployable barriers are provided for use in combination with the conventionally sized trailer, such that when the barriers are not deployed, the magnet may only be operated at a magnetic field intensity which is sufficiently constrained by the mobile MRI trailer (e.g. 1.5 T), and when the barriers are deployed, the magnet may be operated at a higher magnetic field intensity, which is not sufficiently constrained by the mobile MRI trailer (e.g. 3 T), but which is sufficiently constrained within the barriers. An interlock arrangement is provided such that the magnet cannot be operated at the higher magnetic field intensity unless the barriers are detected as being deployed.

The deployable barriers of the present invention may take many forms, but must be carefully designed to fulfill the regulatory requirements, currently that the 5 gauss magnetic field intensity contour to be within the external surfaces of the trailer up to a height of 8 feet (2.5 m) from the ground on which the trailer is sitting.

The barriers could have a continuous or discontinuous surface, provided that any gaps are sufficiently small to maintain effectiveness of the barrier. The barrier may, or may not, include a magnetic shielding layer in addition to conventional shielding fixed onto the trailer. That is to say, the barrier may itself contribute to the magnetic shielding, or may simply serve to exclude persons and equipment from the area which is subjected to a magnetic field in excess of that permitted by regulations.

The barrier could be stored on the sides, on top, and/or under the trailer when not in use. A number of suitable hinge arrangements and retainers would be apparent to those skilled in the art.

The barriers may be permanently attached to the trailer, for example by hinges or hinged arms, or the barriers may be completely removed when not in use.

Figure 2A:
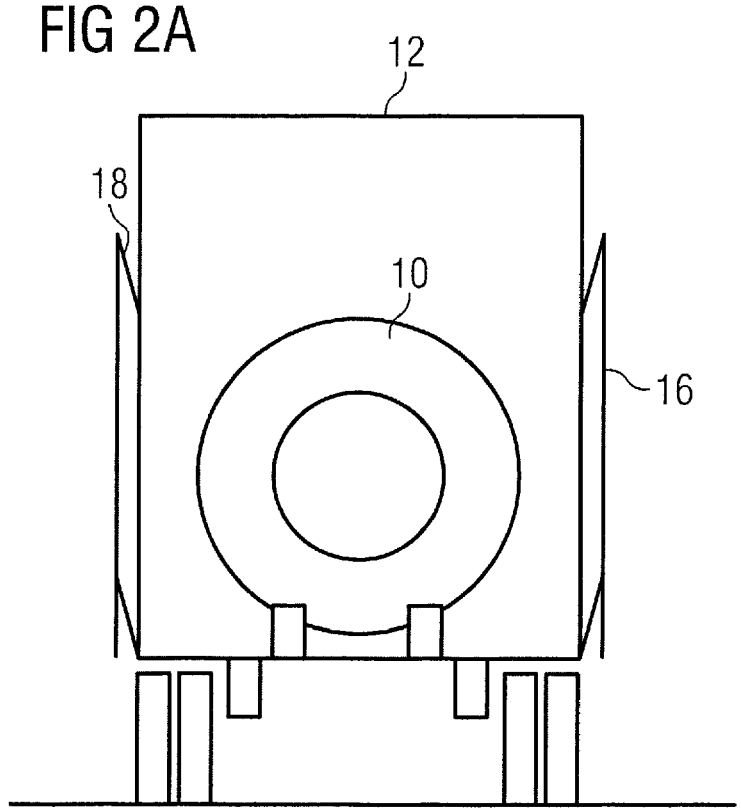
FIG. 2A shows an example embodiment of a trailer equipped with barriers according to the present invention, with the barriers in a stowed position.
Figure 2B:
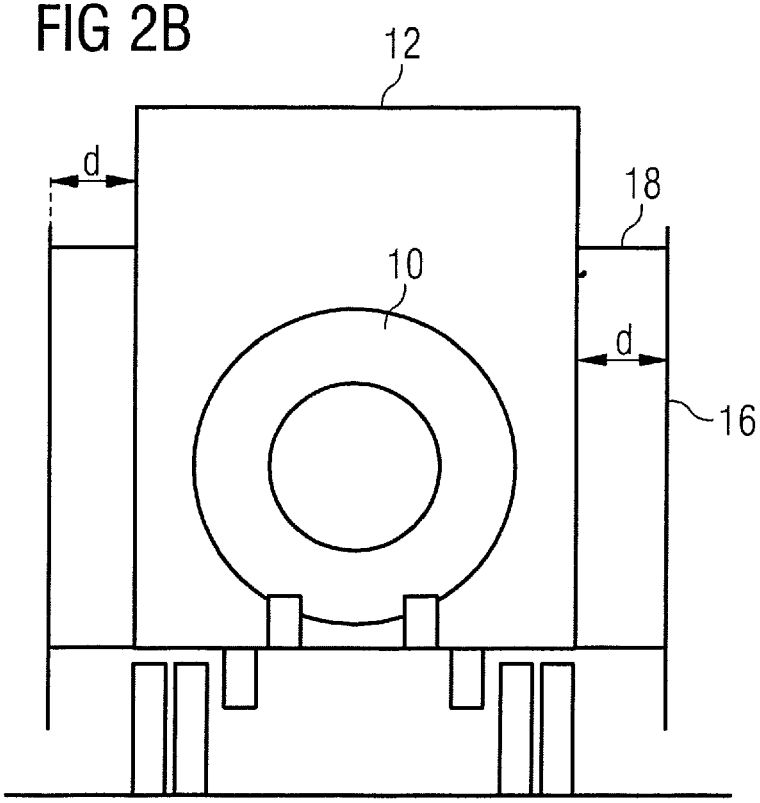
FIG. 2B shows an example embodiment of a trailer equipped with barriers according to the present invention, with the barriers in a deployed position.

FIGS. 2A-2B show an example embodiment of barriers 16 according to the present invention. Such barriers 16 must be effective at preventing any person or any equipment from entering the space between the barriers and the trailer 12.

As shown in FIG. 2A, the barrier 16 may comprise panels mounted on hinged arms 18 such that, when not deployed, the panels are retained against a side of the trailer, and are preferably attached by a tamper-resistant fastener. The presence of the barriers does not significantly increase the outer dimension, or reduce the inner dimensions, of the trailer.

When the MRI system arrives on site, and is ready for installation, the panels are unfastened from the sides of the trailer, and are lowered onto position on the hinged arms. As shown in FIG. 2B, the hinged arms serve to retain the panels of the barrier in position a predetermined distance from the trailer surface. The hinged arms 18 may be telescopic, or otherwise extending, to provide a required separation d from the trailer, the required separation being determined by the strength of the magnet, the shielding provided by the trailer walls, and other considerations to be taken into account when performing simulations as shown in FIG. 1. When deployed, the 5 gauss line 14 (FIG. 1) of the magnet will remain within the barrier 16, even if it does not remain within the trailer 12. Further flaps and extensions to the barrier may be provided to provide a complete barrier around the trailer sufficient to enclose the 5 gauss line to the standard required by the appropriate legislation.

Depending on whether the barrier 16 is to provide magnetic shielding, or simply operate as a physical barrier, it may be formed of sheets of steel, of aluminum, of wire mesh, or of a reinforced plastic material, and so on. It may carry advertising or information material, warning notices, decorative or even camouflage patterns.

The barrier 16 should be provided with an interlock mechanism, which prevents the magnet 10 from operating with a 5 gauss line outside of the trailer 12 until the barrier 16 is correctly deployed. In the case of hinged arms 18 being extending, interlocks should be provided to ensure that the arms are correctly extended before the magnet 10 operates with a 5 gauss line outside of the trailer 12.

In certain embodiments, the barriers may be automatically deployed, may be powered or may be manually deployed.

The interlock arrangement ensures that the magnet is ramped down to a magnetic field strength such that the 5 gauss line lies within the confines of the trailer 12, for example 1.5 T or below, before the barriers 16 are retracted. Similarly, an interlock arrangement is preferably provided to ensure that a towing vehicle cannot be driven whilst the magnet is at a magnetic field in excess of that which may be adequately constrained by the trailer 12 itself, or with the barriers 16 deployed. This may be arranged by coupling of the interlocks to the immobilizer of a towing vehicle. Such interlocks may be provided as a feature of the MRI system controller, typically operating by an on-board computer which has access to information indicating the magnetic field strength of the magnet. Such information is typically provided by a magnet field sensor coupled to the MRI system controller. Alternatively, and if required by legislation, a separate interlock system may be provided, independent of the MRI system controller, with a separate magnet field sensor and means for limiting current in the magnet.

The barriers of the present invention may also serve as weather protection, for example protecting the trailer from deformation due to the effects of wind and sunlight. As mentioned earlier, small displacements of the trailer shielding may cause magnetic field instability. Such displacements may be caused by thermal expansion of shielding material if the trailer is exposed to sunlight, or by mechanical deformation of the trailer is exposed to wind. Both of these effects may be reduced by appropriate design of the barriers 16 of the present invention.

FIG. 3 shows a block diagram of a method operation of a mobile MRI system according to the present invention. At step 31, operation of the MRI systems at a certain site is completed. As part of the shutting down of the MRI system, operation of the magnet at increased magnetic field strength, that is, magnetic field strength in excess of that which can be adequately constrained within the trailer is disabled at step 32. Operation of the magnetic field strength sensor at 33 enables the detection of the strength of the magnetic field at step 34. If the magnetic field strength is not low, that is, is at magnetic field strength in excess of that which can be adequately constrained within the trailer, no action is taken. The status is displayed to a vehicle operator, at step 34a, for example by illumination of a dashboard mounted visual indicator in the cab of the towing vehicle. The magnetic field sensor is read again at step 33. If the magnetic field strength is found to be low at step 34, the barrier deployment interlock is operated so as to enable removal of the barrier at step 35. Reading the condition of the barrier deployment interlock at step 36 enables detection of whether the barrier is still deployed, at step 37. If the barrier is indicated to be still deployed, no action is taken. The status is displayed to a vehicle operator, at step 37a, for example by illumination of a dashboard mounted visual indicator in the cab of the towing vehicle. The barrier deployment interlock is read again at step 36. If the barrier is indicated to be no longer deployed, operation of the towing vehicle is enabled at step 38. The mobile MRI system is then free to travel to its next site, step 39.

On arrival at the next site, the barrier will not be deployed, step 40, and operation of the magnet at increased magnetic field strength will be disabled, step 41. The barrier deployment interlock will be read at step 42. The system will remain in this state until the barrier deployment interlock indicates that the barrier is correctly deployed, step 40. The status is displayed to a vehicle operator, at step 40a, for example by illumination of a dashboard mounted visual indicator in the cab of the towing vehicle. At this time, if not before, operation of the towing vehicle is disabled, step 40b, for example by interaction with the vehicle's immobilizer.

Once the barrier is detected as being deployed, step 40, operation of the magnet at increased magnetic field strength may be enabled, step 43. Preferably, the magnetic field strength sensor is read, step 44, to monitor the actual strength of the magnetic field. If the magnetic field strength is detected, step 45, to be low, the method may return to checking the barrier status at step 40, to ensure that the barrier is still effectively deployed. Once the magnetic field strength is detected, step 45, to be high, operation of the mobile MRI system may be enabled, step 46. The status is displayed to a vehicle operator, at step 45a, for example by illumination of a dashboard mounted visual indicator in the cab of the towing vehicle.

In some embodiments, the barriers may not be attached to the trailer, but means must be provided in such arrangements to ensure that the barriers are deployed in the correct position.

In an improved variant, the barrier deployment interlock may provide one of three state indications: "fully deployed"; "partially deployed"; and "fully retracted". The status "partially deployed" would allow neither operation of the towing vehicle, nor operation of the magnet at high magnetic field strength. Alternatively, two barrier deployment interlock signals may be provided. At step 36, an indication representing "barrier fully retracted?" may control enablement of the towing vehicle, while at step 40 an indication representing "barrier fully deployed?" may be used to control enablement of magnet operation at high magnetic field strengths.

The device is suitable for any MRI system in an enclosed space and is not necessarily exclusive to mobile units. For example, an MRI unit may be positioned in a housing surrounded by substantially vacant space, for example in the form of a car parking facility. The magnet may be maintained in a low magnetic field state until it is required to operate in an imaging process. At that point, the appropriate area surrounding the housing may be cleared of persons and equipment, the barriers deployed and the magnet ramped to a high magnetic field state as described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging system comprising:
   a housing comprising a plurality of deployable barriers attached to the housing;
   a basic field magnet located within said housing;
   a control unit connected to said basic field magnet that operates said basic field magnet to produce a magnetic field at a first magnetic field intensity exhibiting an exterior magnetic field intensity outside of said housing below a safety limit when said barriers are not deployed, and that operates said basic field magnet to produce a magnetic field at a second magnetic field intensity, that is higher than said first magnetic field intensity, when said barriers are deployed, exhibiting an exterior magnetic field intensity outside of said barriers below said safety limit; and
   an interlock associated with said control unit that precludes said control unit from operating said basic field magnet to produce a magnetic field having a magnetic field intensity higher than said first magnetic field intensity unless said barriers are detected as being deployed.

2. A magnetic resonance imaging system as claimed in claim 1 wherein said deployable barriers are detachably attached to said housing.

3. A magnetic resonance imaging system as claimed in claim 1 wherein said deployable barriers are permanently attached to the housing.

4. A magnetic resonance imaging system as claimed in claim 1 wherein said housing comprises a trailer.

5. A magnetic resonance imaging system as claimed in claim 1 wherein said deployable barriers form a discontinuous surface.

6. A magnetic resonance imaging system as claimed in claim 1 wherein each of said deployable barriers comprises a magnetic shielding layer.

7. A magnetic resonance imaging system as claimed in claim 1 wherein said deployable barriers are mounted at a location relative to said housing when not deployed, said location selected from the group consisting of at sides of said housing, on top of said housing, and under said housing.

8. A magnetic resonance imaging system as claimed in claim 1 wherein said deployable barriers are automatically deployable.

9. A magnetic resonance imaging system as claimed in claim 1 wherein said interlock is a first interlock and comprising a second interlock that causes said control unit to operate said basic field magnet at a magnetic field intensity no higher than said first magnetic field intensity before said deployable barriers are retracted.

10. A magnetic resonance imaging system as claimed in claim 1 wherein said housing comprises a trailer configured to be towed by a towing vehicle, and wherein said interlock is a first interlock, and comprising a second interlock configured to preclude said towing vehicle from being driven while said control unit is operating said basic field magnet to produce a magnetic field having a magnetic field intensity higher than said first magnetic field intensity, or while said deployable barriers are at least partially deployed.

11. A magnetic resonance imaging system as claimed in claim 1 wherein said interlock is independent of said control unit and comprises a magnetic field sensor and a current limiter that limits currents supplied to said basic field magnet independently of said control unit.

12. A magnetic resonance imaging system as claimed in claim 1 wherein said housing comprises a trailer, and wherein each of said deployable barriers comprises weather protection that protects said trailer from deformation due to wind and sunlight.

13. A method for operating a magnetic resonance imaging (MRI) system comprising:
    providing a plurality of deployable barriers attached to a housing in which an MRI basic field is located;
    operating said basic field magnet to produce a magnetic field at a first magnetic field intensity exhibiting an exterior magnetic field intensity outside of said housing below a safety limit when said barriers are not deployed, and operating said basic field magnet to produce a magnetic field at a second magnetic field intensity, that is higher than said first magnetic field intensity, when said barriers are deployed, exhibiting an exterior magnetic field intensity outside of said barriers below said safety limit; and
    precluding operation of said basic field magnet to produce a magnetic field having a magnetic field intensity higher than said first magnetic field intensity unless said barriers are detected as being deployed.

14. A method for operating a magnetic resonance imaging system as claimed in claim 13 comprising detachably attaching said deployable barriers to said housing.

15. A method for operating a magnetic resonance imaging system as claimed in claim 13 comprising permanently attaching said deployable barriers to the housing.

16. A method for operating a magnetic resonance imaging system as claimed in claim 13 comprising mounting said housing on a trailer.

17. A method for operating a magnetic resonance imaging system as claimed in claim 13 comprising configuring said deployable barriers to form a discontinuous surface.

18. A method for operating a magnetic resonance imaging system as claimed in claim 13 comprising providing each of said deployable barriers with a magnetic shielding layer.

19. A method for operating a magnetic resonance imaging system as claimed in claim 13 comprising mounting said deployable barriers at a location relative to said housing when not deployed, and selecting said location from the group consisting of at sides of said housing, on top of said housing, and under said housing.

20. A method for operating a magnetic resonance imaging system as claimed in claim 13 comprising automatically deploying said deployable barriers.

21. A method for operating a magnetic resonance imaging system as claimed in claim 13 comprising operating said basic field magnet at a magnetic field intensity no higher than said first magnetic field intensity before said deployable barriers are retracted.

22. A method for operating a magnetic resonance imaging system as claimed in claim 13 comprising mounting said housing on a trailer configured to be towed by a towing vehicle, and comprising precluding said towing vehicle from being driven while said control unit is operating said basic field magnet to produce a magnetic field having a magnetic field intensity higher than said first magnetic field intensity, or while said deployable barriers are at least partially deployed.

23. A method for operating a magnetic resonance imaging system as claimed in claim 13 comprising mounting said housing on a trailer, and providing each of said deployable barriers with weather protection that protects said trailer from deformation due to wind and sunlight.

* * * * *